United States Patent [19]

Noda et al.

[11] Patent Number: 4,768,084
[45] Date of Patent: Aug. 30, 1988

[54] SOLID-STATE IMAGING DEVICE WITH TWO-ROW MIXING GATES

[75] Inventors: Masaru Noda, Kanagawa; Takuya Imaide, Yokohama, both of Japan

[73] Assignee: Hitachi, Ltd., Tokyo, Japan

[21] Appl. No.: 911,418

[22] Filed: Sep. 25, 1986

[30] Foreign Application Priority Data

Sep. 28, 1985 [JP] Japan .................. 60-213673

[51] Int. Cl.$^4$ .......................... H04N 9/07
[52] U.S. Cl. .................. 358/44; 358/213.22
[58] Field of Search .......... 358/44, 41, 43, 213.22, 358/213.23, 213.26, 213.29

[56] References Cited

U.S. PATENT DOCUMENTS 4,460,919 7/1984 Takemura ................... 358/44
4,710,803 12/1987 Suzuki et al. ............... 358/41

FOREIGN PATENT DOCUMENTS 59-144278 8/1984 Japan .

Primary Examiner—Tommy P. Chin
Assistant Examiner—Robert M. Bauer
Attorney, Agent, or Firm—Antonelli, Terry & Wands

[57] ABSTRACT

A MOS solid-state imaging device comprises photoelectric conversion elements (pixels) two-dimensionally arranged in row and column directions, horizontal signal lines arranged one for each horizontal row of pixels, and switches for connecting the vertically adjacent pixels. The switches are parallelly controlled by vertical gate pulses. Thus, mixed signals of the upper and lower pixels are sequentially and horizontally scanned and signals are alternately read from the two horizontal signal lines.

6 Claims, 5 Drawing Sheets

F I G. 5
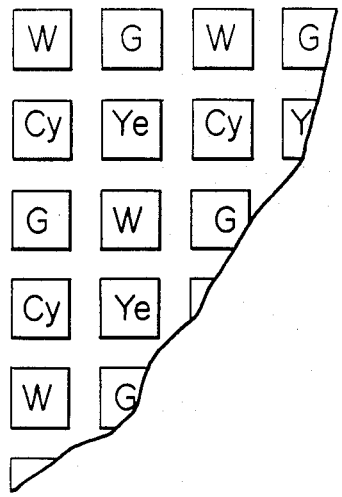
F I G. 6
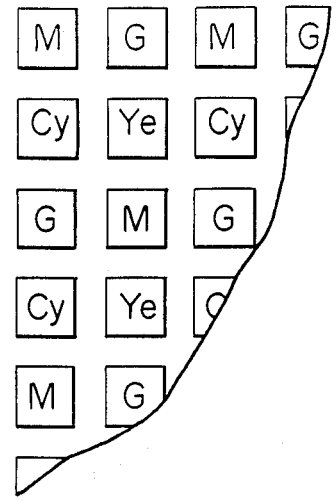
F I G. 8
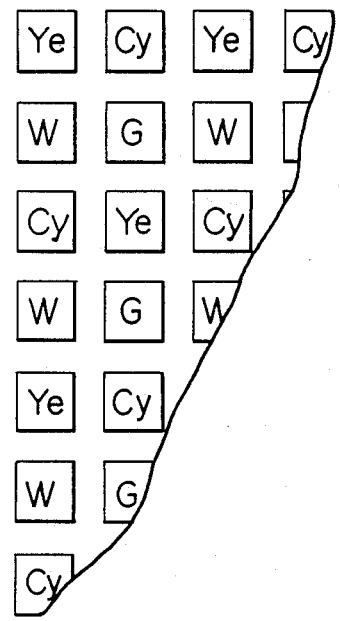
F I G. 9
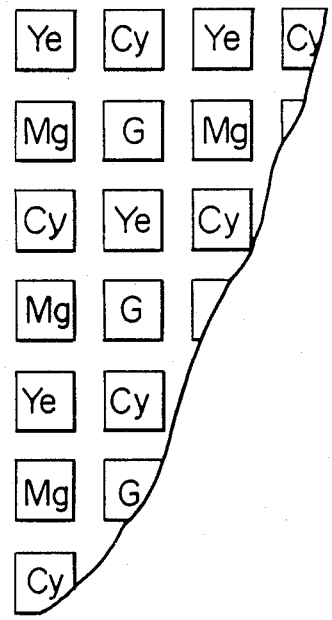

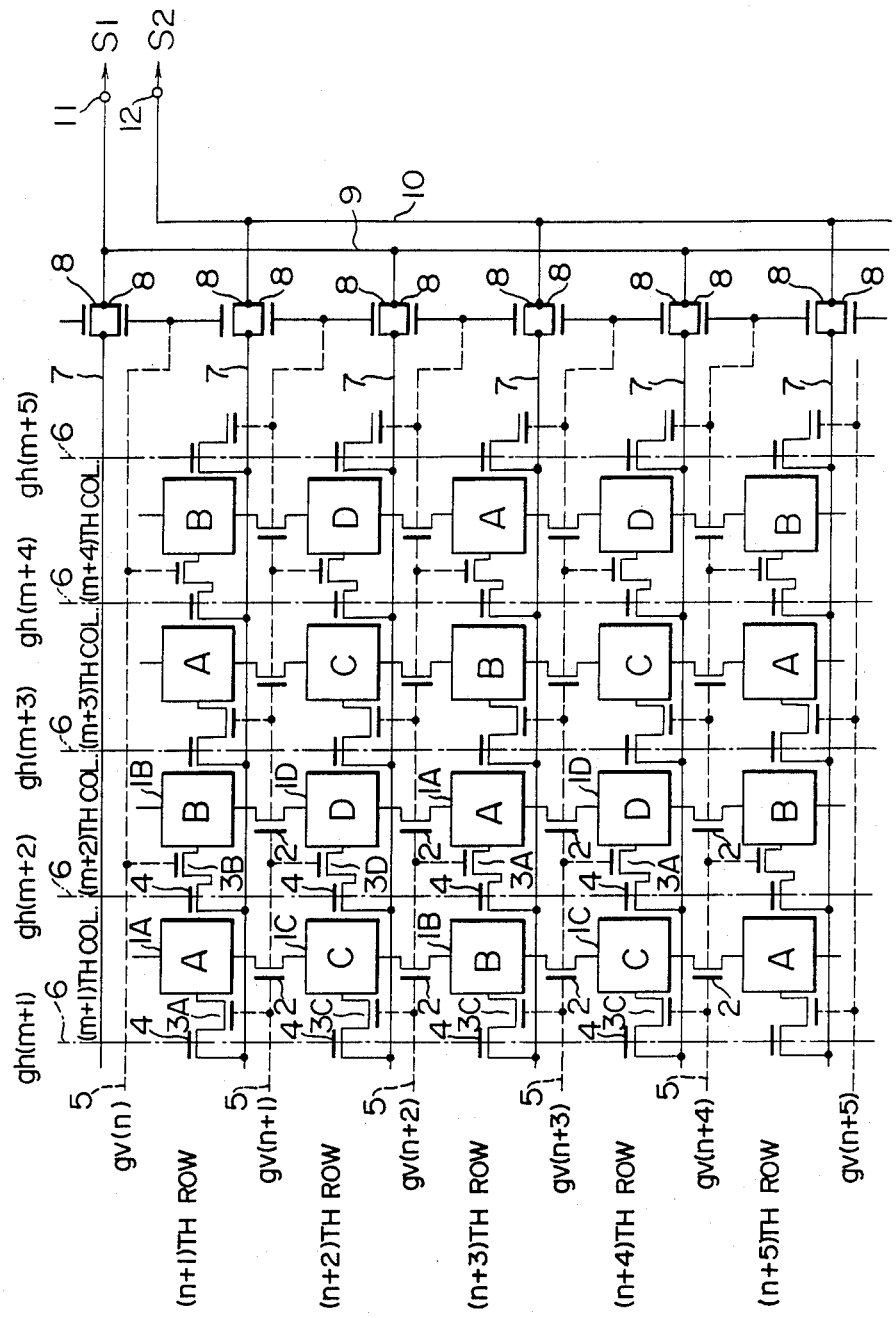

SOLID-STATE IMAGING DEVICE WITH TWO-ROW MIXING GATES

BACKGROUND OF THE INVENTION

The present invention relates to a solid-state imaging device used for a color television camera, and more particularly to a MOS solid-state imaging device which scans two-dimensionally arranged pixels by an X-Y switch matrix.

In solid-state imaging devices, a number of two-dimensionally arranged pixels each having a function of storing a signal charge representing a sensed light and scan means for reading the signal charges from the pixels in a predetermined sequence are integrally solidified by semiconductor integration circuit technology. Of those solid-state imaging devices, one which scans by the X-Y matrix is called an X-Y address type (or MOS type), and various drive methods therefor have been proposed. For example, in a solid-state imaging device shown in JP-A-59-144278 by the present assignee, particularly in FIG. 5, two lines of pixels are parallelly and horizontally scanned, where the horizontal direction (X-direction) of the pixel array is defined as a row and the vertical direction (Y-direction) is defined as a column. For an interlaced scan, a combination of two rows of pixels which are parallelly scanned is changed between an odd-numbered field and an even-numbered field by an interlace switch so that signal charges are read from all pixels in each field. As a result, no residual image is produced.

In color imaging, a plurality of chrominance signals must be parallelly produced, and the two-row parallel scan system described above is suitable for the purpose. Color imaging by the two-row parallel scan system is explained below.

For color imaging, color filters are provided one for each pixel. FIG. 1 shows an example of arrangement of the color filters. W denotes a transparent filter, G denotes a green light transmission filter, Cy denotes a cyan light transmission filter, and Ye denotes a yellow light transmission filter. They are referred to as W, G, Cy and Ye filters, respectively. Two rows, n-th and (n+1)th rows are shown in FIG. 1 and filters for four pixels in each row are shown. In the n-th row, the W filters are arranged at every other pixel and the G filters are arranged at another set of every other pixel. In the (n+1)th row, the Cy filters are arranged at every other pixel and the Ye filters are arranged at another set of every other pixel.

In the solid-state imaging device shown in the above JP-A-59-144278, two rows of pixels are parallelly scanned. When the filter array shown in FIG. 1 is applied to that solid-state imaging device and the n-th and (n+1)th rows are parallelly scanned, a first signal is produced from the n-th row, which signal alternately comprises signal charges (W charges) from the pixels covered by the W filters and G charges, and a second signal is produced from the (n+1)th row, which signal alternately comprises Cy charges and Ye charges. The first and second signals are two-phase sampled. The first signal is separated into the W charges and the G charges to produce a signal (W signal) which comprises the W charges and a G signal which comprises the G charges. Similarly, the second signal is separated into the Cy charges and Ye charges to produce a Cy signal and a Ye signal. An r (red) signal and a b (blue) signal are synthesized from those signals as follows.

$$r = (W - Cy) + (Ye - G) \quad (1)$$

$$b = (W - Ye) + (Cy - G) \quad (2)$$

An intensity signal Y is produced by adding the first and second signals.

The above technique provides one method of color imaging but includes the following problems because it separates the signals by the two-phase sampling.

(1) A configuration of a sampling circuit and a sampling pulse generator for driving the sampling circuit is complex.

(2) The signal produced by the sampling includes noises at a sampling frequency and frequencies of high-order harmonics and hence an S/N ratio of the signal is low.

The item (2) creates a problem when a signal which includes noises having a spectrum which increases with the frequency such as a signal produced by amplifying an output signal of the solid-state imaging device by a feedback preamplifier is applied to the sampling circuit.

Accordingly, it is desirable to produce separate signals for the respective pixels having different color filters, without sampling.

One approach thereto is to arrange two horizontal signal lines for each row so that the signal charges from the pixels having the same color filters are transferred to one of the signal lines. Thus, the signal charges read through different color filters are transferred to the other signal line and hence the sampling is not necessary. However, this approach increases the wiring space necessary for the horizontal signal lines and decreases the space factor (aperture factor) of the pixels, resulting in reduction of sensitivity.

SUMMARY OF THE INVENTION

It is an object of the present invention to provide a high-sensitivity solid-state imaging device with two-row parallel readout functions in which only one horizontal signal line is arranged for each row and which produces a luminance signal and chrominance signals without sampling.

In order to achieve the above object, in accordance with the present invention, pixels which are vertically adjacent to each other are coupled through switches and the switches between pixels of the two parallelly read rows are turned on to combine the signal charges of the vertically adjacent pixels of those two rows so that the combined signal charges by the combination of one set of the color filters are read from one of the two rows and the combined charges by the combination of the other set of color filters are read from the other row.

In the chrominance signal generation operation described above, the formulas (1) and (2) may be represented as follows.

$$r = (W - Ye) - (Cy - G) \quad (1a)$$

$$b = (W - Cy) - (Ye - G) \quad (2a)$$

It is seen from those formulas that the r and b signals can be produced by a subtraction operation of (W+Ye) and (Cy+G), and (W+Cy) and (Ye+G). Thus, a sampling means for separately producing W, Ye, Cy and G is not necessary.

On the other hand, in the color filter array shown in FIG. 1, the W filters and the Cy filters are vertically arranged, and the G filters and the Ye filters are vertically arranged, in the n-th and (n+1)th rows. When the n-th and (n+1)th rows are parallelly read, (W+Cy) and (G+Ye) can be produced by adding the signal charges from the respective two vertically arranged pixels. If the arrangement of the W filters and the G filters in the n-th row is reversed in the (n+1)th row, and the (n+1)th row and the (n+2)th row are parallelly read, (G+Cy) and (W+Ye) are produced.

In accordance with the present invention which utilizes the above finding, sampling or addition of signal lines for separating signals for the respective color filters from the output signal, which has been heretofore required to produce the chrominance signals or differential chrominance signals from the output signal, is no longer necessary. As a result, a circuit configuration of a television camera is simplified and the size and cost thereof are reduced. In addition, an S/N ratio of the chrominance signal is significantly improved and an aperture factor of the pixels is significantly increased and the sensitivity is significantly improved. Thus, a solid-state imaging device which does not raise the problems described above is provided.

BRIEF DESCRIPTION OF THE DRAWINGS

FIGS. 5 and 6 show arrangements of color filters in FIG. 2,

FIG. 7 shows a configuration of another embodiment of the solid-state imaging device of the present invention, FIGS. 8 and 9 show arrangements of color filters in FIG. 7, and FIGS. 10 and 11 show timing charts for a vertical gate pulse and a horizontal gate pulses, respectively.

DESCRIPTION OF THE PREFERRED EMBODIMENTS

Figure 2:
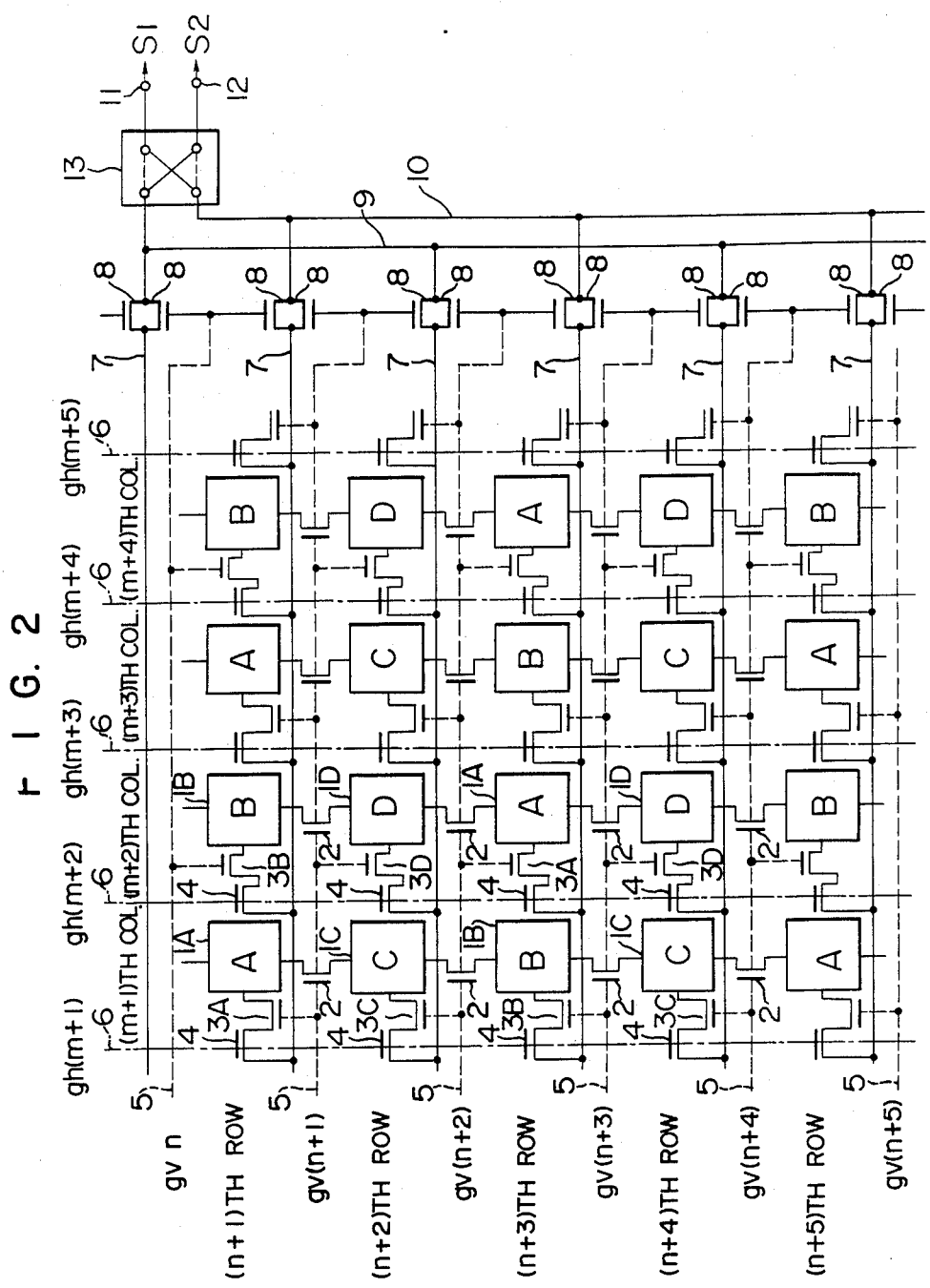
FIG. 2 shows a configuration of one embodiment of a solid-state imaging device of the present invention.

FIG. 2 shows a configuration of one embodiment of the solid-state imaging device of the present invention. Numerals 1A–1D denote pixels, numeral 2 denotes a mixing gate, numeral 3A–3D denote vertical (column) gates, numeral 4 denote a horizontal (row) gate, numeral 5 denotes a vertical gate line, numeral 6 denotes a horizontal gate line, numeral 7 denotes a horizontal signal line, numeral 8 denotes a selection switch, numerals 9 and 10 denote vertical signal lines, numerals 11 and 12 denote output terminals, and numeral 13 denotes a switch. The mixing gate 2, vertical gates 3A–3D, horizontal gate 4 and selection switch 8 are constructed by MOS FET's.

A number of pixels 1 are two-dimensionally arranged. (They are designated by numeral 1 unless a specific pixel is to be identified.) In FIG. 2, the pixels 1 in (n+1)th to (n+5)th rows and (m+1)th to (m+4)th columns are shown. Color filters are arranged in the respective pixels 1. Four types of color filters A, B, C and D are used. The pixels 1 having the filters A arranged thereon are designated by 1A, and the pixels 1 having the filters B, C and D arranged thereon are designated by 1B, 1C and 1D, respectively.

The pixels 1A and 1B are alternately arranged in every other row, that is, (n+1)th, (n+3)th and (n+5)th rows. In those rows, the arrangement of the pixels 1A and 1B are opposite in one set of every other row and the other set of every other row. The pixels 1C and 1D are alternately arranged in the other set of every other row, that is, in the (n+2)th and (n+4)th rows.

The vertical gate line 5 and the horizontal signal line 7 are arranged in each row. Connected to each signal line 7 are all pixels 1 of that row through the vertical gates 3 (which are designated by 3 unless a specific vertical gate is to be identified) and the horizontal gates 4. In each row, the vertical gates 3 connected to every other pixel 1 are simultaneously turned (gated) on and off by a vertical gate pulse supplied through the vertical gate line 5 arranged in that row, and the vertical gates 3 connected to the other set of every other pixel 1 are simultaneously turned on and off by the vertical gate pulse supplied through the vertical gate line 5 arranged in the immediately previous row. In each column, all of the horizontal gates 4 connected to the pixels 1 are simultaneously turned on and off by a horizontal gate pulse supplied through the horizontal gate line 6.

Figure 10:
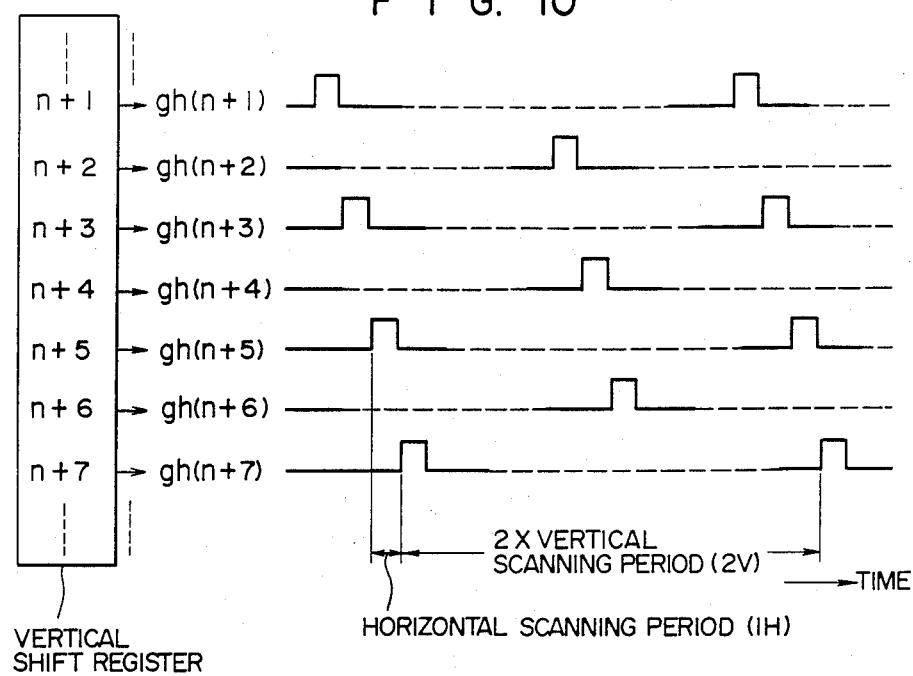
Figure 11:
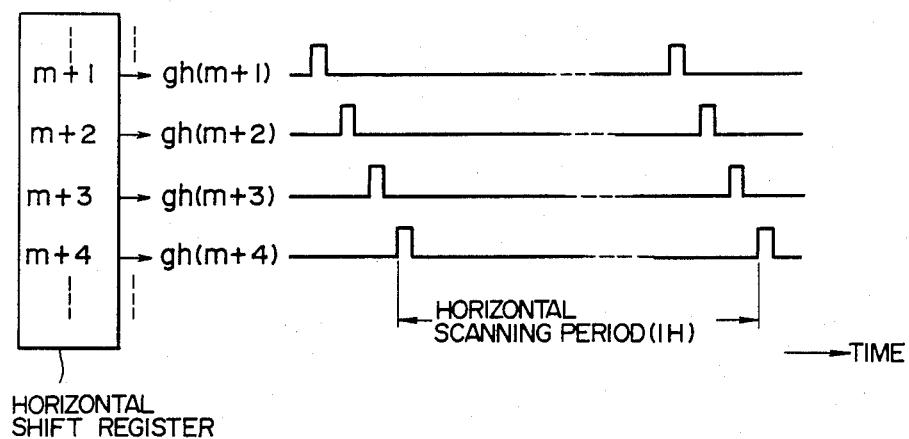

The repetition frequencies and phases of the horizontal gate pulse and the vertical gate pulse are determined depending on the total number of pixels and a particular television system. The gate pulses may be generated by clock signal generator means and shift registers as is done in a known solid-state imaging device. FIGS. 10 and 11 show examples of gate pulses for driving the device of FIG. 2. FIG. 10 shows a timing chart of the vertical gate pulse and FIG. 11 shows a timing chart of the horizontal gate pulse.

One set of every other horizontal signal line 7 is connected to one vertical signal line 9 through the selection gate 8, and the other set of every other horizontal signal line 7 is connected to the other signal line 10 through the selection gate 8. The selection gate 8 selects the horizontal signal line 7 to be electrically connected to the vertical signal line 9 or 10 and it is turned on and off by the vertical gate pulse supplied through the vertical gate line 5. The vertical signal lines 9 and 10 are selectively connected to the output terminals 11 and 12 by the switches 13.

Each pixel 1 is connected with the vertically adjacent opposite pixels 1 through the mixing gates 2 which are turned on and off by the vertical gate pulse supplied through the vertical gate line 5. More specifically, the mixing gate 2 which connects the pixel 1 in the (n+1)th row with the pixel 1 in the (n+2)th row is turned on and off by the vertical gate pulse supplied through the vertical gate line 5 arranged in the (n+1)th row.

In this arrangement, the signal charges are parallelly read out in the adjacent two rows. The rows are interlace-scanned so that the combination of two parallelly read rows is changed between an odd-numbered field and an even-numbered field.

The signal read operation is now specifically described.

In the odd-numbered field, let us assume that the signal charges of the (n+1)th and (n+2)th rows are read at a certain time.

In this case, a vertical gate pulse gv (n+1) is supplied through the vertical gate line 5 arranged in the (n+1)th row over one horizontal scan period. Thus, the mixing gates 2 between the pixels 1 in the (n+1)th row and the pixels 1 in the (n+2)th row are turned on, and the vertical gates 3A connected to every other pixel 1A in the (n+1)th row and the vertical gates 3D connected to every other pixel 1D in the (n+2)th row which are horizontally shifted by one pixel relative to the pixels 1A, are simultaneously turned on. The selection gate 8 between the signal line 7 of the (n+1)th row and the vertical signal line 10, and the selection gate 8 between the signal line 7 of the (n+2)th row and the vertical signal line 9 are also simultanoeusly turned on by the vertical gate pulse gv (n+1). Thus, the two horizontal signal lines 7 to be parallelly read are simultaneously selected.

Under this condition, horizontal gate pulses gh (m+1), gh (m+2), gh (m+3), gh (m+4) and gh (m+5) are sequentially supplied to the horizontal gate lines 6. When the horizontal gate pulse gh (m+1) is supplied to the horizontal gate line 6 of the (m+1)th column, all of the horizontal gates in that column are simultaneously turned on. As a result, only the pixel 1A of the (n+1)th row and the (m+1)th column is electrically connected to the horizontal signal line 7 of the (n+1)th row through the vertical gate 3A and the horizontal gate 4, and the signal charge from the pixel 1A is transferred to the horizontal signal line 7 of the (n+1)th row and to the vertical signal line 10 through the selection switch 8. Since the pixel 1A and the pixel 1C at the (n+2)th row and the (m+1)th column are electrically connected through the mixing gate 2, the signal charge read from the pixel 1A is a combined charge of the signal charge produced at the pixel 1A (hereinafter signal charge A) and the signal charge produced at the pixel 1C (hereinafter signal charge C). (Hereinafter, the combined charge is called a signal charge (A+C)).

Then, the horizontal gate pulse gh (m+2) is supplied to the horizontal gate line 6 of the (m+2)th column. Thus, all of the horizontal gates 4 of that column are simultaneously turned on, and only the pixel 1D at the (n+2)th row and the (m+2)th column is electrically connected to the horizontal signal line 7 of the (n+2)th row through the vertical gate 3D and the horizontal gate 4. As a result, a combined charge (hereinafter signal charge (B+D)) of a signal charge produced at the pixel 1D (hereinafter signal charge D) and a signal charge produced at the pixel 1B of the (n+1)th row and the (m+2)th column (hereinafter signal charge B) is read from the pixel 1D, and the signal charge (B+D) is transferred to the vertical signal line 9 through the horizontal signal line 7 and the selection switch 8 of the (n+2)th row.

Similarly, when the horizontal gate pulse gh (m+3) is supplied to the horizontal gate line 6 of the (m+3)th column, the signal charge (A+C) is transferred from the pixel 1A at the (n+1)th row and the (m+3)th column to the vertical signal line 10 through the horizontal signal line 7 and the selection switch 8 of the (n+1)th row. When the horizontal gate pulse gh (m+4) is supplied to the horizontal gate line 6 of the (m+4)th column, the signal charge (B+D) is transferred from the pixel 1D at the (n+2)th row and the (m+4)th column to the vertical signal line 9 through the horizontal signal line 7 and the selection switch 8 of the (n+2)th row.

In this manner, the horizontal gate pulses are sequentially supplied to the columns and the signal charge (A+C) and the signal charge (B+D) are alternately transferred to the vertical signal lines 10 and 9, respectively. As a result, a signal comprising the signal charges (A+C) (hereinafter signal (A+D)) is produced in the vertical signal line 10, and a signal comprising the signal charges (B+D) (hereinafter signal (B+D)) is produced in the vertical signal line 9.

The horizontal gate pulses are supplied to all horizontal gate lines 6 in one horizontal scan period, and the signal charges (A+C) from all pixels 1A in the (n+1)th row and the signal charges (B+D) from all pixels 1D in the (n+2)th row are read in the same period. Thus, the signal (A+C) of one horizontal scan period is produced in the vertical signal line 10, and the signal (B+D) of one horizontal scan period is produced in the vertical signal line 9.

The switch 13 is switched between the solid line position and the broken line position for each horizontal scan period. When the switch 13 is at the solid line position, the output terminal 11 is connected to the vertical signal line 10 and the output terminal 12 is connected to the vertical signal line 9. Accordingly, signals $S_1$ and $S_2$ are produced at the output terminals 11 and 12.

$$S_1 = A + C \\ S_2 = B + D \quad (3)$$

In the next horizontal scan period, the vertical gate pulse gv (n+3) is applied to the vertical gate line 5 of the (n+3)th row which is one row skipped. Thus, the above operation to performed in the (n+3)th row and the (n+4)th row. Since the arrangement of the pixels 1A and 1B in the (n+3)th row is opposite to that in the (n+1)th row, a signal by the mixed signal charges of the signal charge B and the signal charge C (hereinafter signal (B+C)) is produced in the vertical signal line 10, and a signal by the mixed charges of the signal charge A and the signal charge D (hereinafter signal (A+D)) is produced in the vertical signal line 9. Since the switch 13 is now in the broken line position, the signals $S_1$ and $S_2$ produced at the output terminals 11 and 12 are represented as follows.

$$S_1 = A + D \\ S_2 = B + C \quad (4)$$

In this manner, the signals $S_1$ and $S_2$ represented by the formulas (3) and (4) are alternately produced at the output terminals 11 and 12 for each horizontal scan period.

The signals $S_1$ and $S_2$ are supplied to a signal processing circuit (not shown) where the luminance signal Y and chrominance signals $C_1$ and $C_2$ are produced by the following operation $$Y = S_1 + S_2 \\ C_1, C_2 = S_1 - S_2 \quad (5)$$

The chrominance signal $C_1$ is produced in one set of every other horizontal scan period and the chrominance signal $C_2$ is produced in the other set of every other horizontal scan period. Accordingly, in one set of every other horizontal scan period, $$Y = A + B + C + D \\ C_1 = (A + C) - (B + D)$$ (6)

and in the other set of every other horizontal scan period, $$Y = A + B + C + D \\ C_2 = (A + D) - (B + C)$$ (7)

In the even-numbered field, the vertical gate pulses are sequentially applied to the vertical gate lines of those rows to which vertical gate pulses were not applied in the odd-numbered field.

When the vertical gate pulse gv (n+2) is supplied to the vertical gate line 5 of the (n+2)th row, the horizontal scan lines of the (n+2)th row and the (n+3)th row are simultaneously selected by the selection gate 8 and the signal charges of the pixels 1C of the (n+2)th row and the pixels 1A of the (n+3)th row are sequentially read. As a result, the signal (A+D) is produced in the vertical signal line 10, and the signal (B+C) is produced in the vertical signal line 9. Since the switch 13 is now in the solid line position, the signals $S_1$ and $S_2$ represented by the formula (4) are produced at the output terminals 11 and 12.

Then, the vertical gate pulse gv (n+4)th is supplied to the vertical gate line 5 of the (n+4)th row. Thus, the (n+4)th row and the (n+5)th row are simultaneously read, and the signal (B+D) is produced in the vertical signal line 10 and the signal (A+C) is produced in the vertical signal line 9. Since the switch 13 is now in the broken line position, the signals $S_1$ and $S_2$ represented by the formula (3) are produced at the output terminals 11 and 12.

In this manner, in the even-numbered field, the signals $S_1$ and $S_2$ represented by the formulas (3) and (4) are alternately produced at the output terminals 11 and 12 for each horizontal scan period. Thus, the signals represented by the formulas (6) and (7) are alternately produced by the above signal processing circuit for each horizontal scan period.

Figure 1:
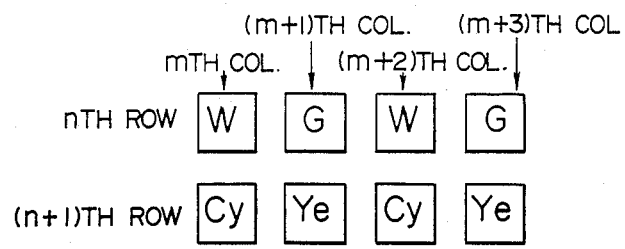
FIG. 1 shows a partial arrangement of color filters in a solid-state imaging device for producing a color video signal.
Figure 3:
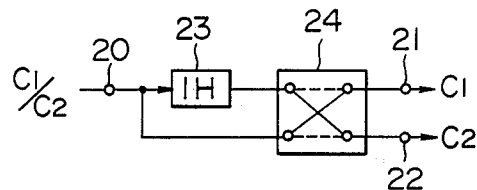
FIG. 3 shows a block diagram of an embodiment of a line interpolation circuit for parallelizing line sequential signals produced by processing output signals of FIG. 2.

In the present embodiment, the chrominance signals $C_1$ and $C_2$ are produced in line sequence. In order to parallelize them, a line interpolation circuit shown in FIG. 3 may be used. In FIG. 3, numeral 20 denotes an input terminal, numerals 21 and 22 denote output terminals, numeral 23 denotes a 1H delay line (where 1H represents one horizontal period which is a sum of one horizontal scan period and one horizontal flyback period), and numeral 24 denotes a switch.

The line sequential chrominance signals $C_1/C_2$ are supplied to the switch 24 directly on one hand and through the 1H delay line on the other hand. The switch 24 is switched between the solid line position and the broken line position for each 1H period. Thus, one chrominance signal $C_1$ of the line sequential chrominance signals $C_1/C_2$ from the input terminal 20 and the same chrominance signal $C_1$ of the line sequential chrominance signals $C_1/C_2$ from the 1H delay line 23 are produced at one output terminal 21, and the other chrominance signals $C_2$ of the line sequential chrominance signals $C_1/C_2$ are produced at the other output terminal 22.

In this manner, the chrominance signal $C_1$ is continuously produced at the output terminal 21 and the chrominance signal $C_2$ is continuously produced at the output terminal 22.

In the present embodiment, the signal $S_1$ and $S_2$ produced at the output terminals 11 and 12 can produce the luminance signal and the chrominance signals when they are processed. Accordingly, the luminance signal and the chrominance signals can be generated without sampling to separate signals for each color filter, and the S/N ratio of the signals can be significantly enhanced. A complex sampling means is not required. Only one horizontal signal line needs to be arranged in each row and the aperture factor of the pixel can be increased and the sensitivity is increased.

Figure 4:
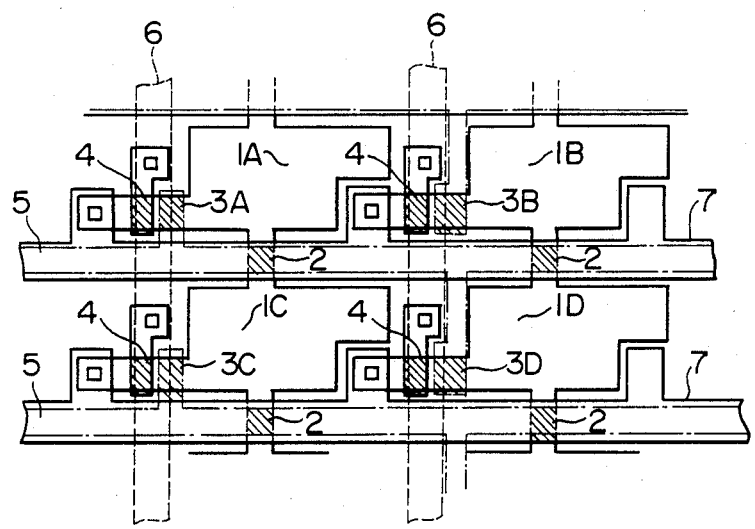
FIG. 4 shows a plan view of a layout of FIG. 2.

FIG. 4 shows an example of partial layout of FIG. 2. The corresponding elements in FIG. 4 are designated by like numerals.

Each wiring comprises a two-layered polysilicon layer and a two-layered aluminum layer. Hatched areas represent MOS switches of gates.

FIG. 5 shows an arrangement of the color filters of FIG. 2, in which
 A=W (transparent)
 B=G (green light transmission)
 C=Cy (cyan light transmission)
 D=Ye (yellow light transmission)
Accordingly, from the formulas (6) and (7), $$Y = W + G + Cy + Ye$$

$$C_1 = (W + Cy) - (G + Ye)$$

$$C_2 = (W + Ye) - (G + Cy)$$

Thus, the signal $C_1$ is the b (blue) signal, and the signal $C_2$ is the r (red) signal.

FIG. 6 shows another arrangement of the color filters of FIG. 2, in which
 A=Mg (magenta light transmission)
 B=G
 C=Cy
 D=Ye
Accordingly, from the formulas (6) and (7), $$Y = Mg + G + Cy + Ye$$

$$C_1 = (Mg + Cy) - (G + Ye)$$

$$C_2 = (Mg + Ye) - (G + Cy)$$

The signal $C_1$ has a spectrum sensitivity close to a color difference signal (b−Y), and the signal $C_2$ has a spectrum sensitivity close to a color difference signal (r−Y).

FIG. 7 shows another embodiment of the solid-state imaging device of the present invention. Like elements to those shown in FIG. 2 are designated by like numerals.

The FIG. 7 embodiment is different from the embodiment shown in FIG. 2 only in that the switch 13 has been removed. Accordingly, the operation is essentially the same as that of the embodiment of FIG. 2, except that the signal produced in the vertical signal line 9 is always supplied to the output terminal 11 to produce the signal $S_1$, and the signal produced in the vertical signal line 10 is always supplied to the output terminal 12 to produce the signal $S_2$.

As seen from the explanation to FIG. 2, in every other horizontal scan period, $$S_1 = B + D \\ S_2 = A + C \quad\quad (8)$$

and in the other set of every other horizontal scan period, $$S_1 = A + D \\ S_2 = B + C \quad\quad (9)$$

Accordingly, in every other horizontal scan period, the following luminance signal Y and chrominance signal $C_1$ are produced, from the formulas (5) and (8).

$$Y = S_1 + S_2 = A + B + C + D \\ C_1 = (B + D) - (A + C) \quad\quad (10)$$

In the other set of every other horizontal scan period, the following luminance signal Y and chrominance signal $C_2$ are produced, from the formulas (5) and (9).

$$Y = S_1 + S_2 = A + B + C + D \\ C_2 = (A + D) - (B + C) \quad\quad (11)$$

In order for those signals $C_1$ and $C_2$ to be r signal and b signal, the following condition is to be met.

A = Ye
B = Cy
C = W
D = G

The arrangement of the color filters in FIG. 7 is shown in FIG. 8. When the W filter is replaced by a Mg filter as shown in FIG. 9, the signal $C_1$ in the formula (10) changes to the color difference signal $(r-Y)$ and the signal $C_2$ changes to the color difference signal $(b-Y)$.

The FIG. 7 embodiment offers the same advantages as those presented by the embodiment of FIG. 2, and the circuit configuration is further simplified by the elimination of the switch 13.

We claim:

1. A solid-state imaging device having a number of two-dimensionally arranged pixels of photo-electric conversion elements for producing a video signal by sequentially reading photo-electrically converted charges from the pixels, comprising:
   horizontal signal lines arranged in correspondence with each row of pixels;
   horizontal gates and vertical gates connected between the pixels of each row and the corresponding horizontal signal line and controlled by gate signals; and
   mixing gates connected between adjacent pixels of each column of pixels,
   wherein respective ones of said vertical gates connected to diagonally adjacent pixels of two adjacent rows and the mixing gates connected between vertically adjacent pixels of said two adjacent rows are simultaneously turned on such that the signal charges of two vertically adjacent pixels of said two adjacent rows are combined into one signal.

2. A solid-state imaging device according to claim 1 wherein color filters of a first type and color filters of a second type are alternately arranged at the pixels of a first set of pixels which is comprised of alternate rows of pixels, color filters of a third type and color filters of a fourth type are alternately arranged on the pixels of a second set of alternate rows of pixels, and wherein the first type color filters and the second type color filters are arranged in an opposite relation between alternate rows of pixels.

3. A solid-state imaging device according to claim 1 further comprising selection switches for permitting a supply of signals of different two adjacent rows of pixels from said horizontal signal lines to vertical signal lines.

4. A solid-state imaging device according to claim 2 wherein said first type color filters transmit all color lights, said second type color filters transmit green light, said third type color filters transmit cyan light and said fourth type color filters transmit yellow light.

5. A solid-state imaging device according to claim 2 wherein said first type color filters transmit magenta light, said second type color filters transmit green light, said fourth type color filters transmit cyan light and said fourth type color filters transmit yellow light.

6. A solid-state imaging device having a number of two-dimensionally arranged pixels of photo-electric conversion elements for generating a video signal by sequentially reading photo-electrically converted charges from the pixels, comprising:
   row signal lines arranged in correspondence with each row of pixels;
   row gates and column gates connected between the pixels of each row and the corresponding row signal line and controlled by gate signals;
   mixing gates connected between adjacent pixels of each column of pixels; and
   means for simultaneously gating the column gates connected to diagonally adjacent pixels of two adjacent rows and the mixing gates connected between vertically adjacent pixels of said two adjacent rows to enable signal charges of two vertically adjacent pixels of said two adjacent rows to be combined into one signal.

* * * * *